(12) United States Patent
McLellan et al.

(10) Patent No.: US 6,429,048 B1
(45) Date of Patent: Aug. 6, 2002

(54) METAL FOIL LAMINATED IC PACKAGE

(75) Inventors: Neil McLellan; Chun Ho Fan, both of Sham Tseng; Kwok Cheung Tsang, N. T.; Pik Ling Lau, Chuk Yuen North EST, all of (HK)

(73) Assignee: ASAT Ltd., Tsuen Wan (HK)

( * ) Notice: Subject to any disclaimer, the term of this patent is extended or adjusted under 35 U.S.C. 154(b) by 19 days.

(21) Appl. No.: 09/730,440

(22) Filed: Dec. 5, 2000

(51) Int. Cl.[7] .................. H01L 21/44; H01L 21/48; H01L 21/50

(52) U.S. Cl. .............. 438/108; 438/107; 438/108; 438/110; 438/121; 438/122; 438/124; 438/125; 438/126; 438/127

(58) Field of Search ................. 438/107, 108, 438/110, 118, 119, 121, 122, 124, 125, 126, 127; 174/250, 255, 256; 361/750

(56) References Cited

U.S. PATENT DOCUMENTS

| | | | |
|---|---|---|---|
| 5,397,921 A | | 3/1995 | Karnezos |
| 5,409,865 A | | 4/1995 | Karnezos |
| 5,572,405 A | * | 11/1996 | Wilson et al. ............... 361/705 |
| 5,759,737 A | * | 6/1998 | Feilchenfeld et al. ....... 430/311 |
| 5,843,808 A | | 12/1998 | Karnezos |
| 6,207,354 B1 | * | 3/2001 | Bhatt et al. ................. 430/313 |

* cited by examiner

*Primary Examiner*—David L. Talbott
*Assistant Examiner*—David A. Zarneke
(74) *Attorney, Agent, or Firm*—Keating & Bennett, LLP

(57) ABSTRACT

A method of fabricating an integrated circuit package for ball grid arrays, comprising the steps of: laminating layers of fiberglass prepreg and copper foil to a copper plate in order to create a three-layer laminated carrier; patterning and etching contact pads for input/output and a power/ground ring; applying a solder mask and plating up the contact pads and the ring with a wire bondable metal surface; forming window openings for receiving semiconductor dies; attaching the dies within the windows, wire bonding the dies to the contact pads and the ring, encapsulating the dies, attaching solder balls to the contact pads to create finished packages and singulating the finished packages into individual packages; and attaching the copper plate portion of each of the individual packages to copper plate heat spreader.

14 Claims, 4 Drawing Sheets

METAL FOIL LAMINATED IC PACKAGE

FIELD OF THE INVENTION

The present invention relates generally to packaging for integrated circuit (IC) devices, and in particular to a method of fabricating a metal foil laminated package for ball grid arrays.

BACKGROUND OF THE INVENTION

As thermal and electrical requirements of IC packages become more demanding, advanced forms of package construction have been developed. In general, array packaging such as Pin-Ball Grid Array (PBGA) provides for a high density of interconnects relative to the surface area of the package. However, typical PBGA packages are characterized by a convoluted signal path, giving rise to high impedances and an inefficient thermal path which results in low thermal dissipation performance.

Applicants' prior Tape Ball Grid Array (TBGA) product is an advanced IC package having straight signal paths and a copper backed, die down construction which enjoys enhanced performance over prior art PBGA packages. However, this TBGA design suffers from complex construction in which heatsinks are precisely laminated to the substrate with expensive polyimide tape in a post etch operation. Further, the presence of polyimide between the heatsink and the copper traces of the tape minimizes the effectiveness of routing the traces in close proximity to the grounded heatsink.

Additional prior art packages include the well known Super BGA package which has an organic substrate attached to a metal backing. However, the organic layer between the I/O balls and the thermal grounding of the heatsink results in severe limitations to the conduction of heat flowing to the balls from the metal backing.

Similarly, the prior art Prolinx™ BGA and STI™ BGA are built up structures over metal backings wherein the built up layered structures include silver filled epoxy to act as a layer-to-layer interconnect. However, they require machined cavities and complex routing techniques which reduce cost effectiveness. From a cost point of view, these products are considered to be expensive, and require very specialized construction techniques to fabricate them.

Further examples of prior art Tab Grid Arrays are described in:

U.S. Pat. No. 5,397,921 issued Mar. 14, 1995;
U.S. Pat. No. 5,409,865 issued Apr. 25, 1995;
U.S. Pat. No. 5,843,808 issued Dec. 1, 1998.

SUMMARY OF THE INVENTION

According to one aspect of the present invention there is provided an IC package having a laminate substrate design built using copper sheet instead of the glass reinforced resin normally used. The metal foil laminated package of the present invention eliminates the requirement for expensive polyimide tape. A further advantage of the IC package of the present invention is that the accuracy of the artwork relative to the die attach cavity is an inherent feature of the way the package is manufactured. This precludes any alignment inaccuracies of tape to heatsink attachment which can cause problems in prior art. According to a further aspect of the invention, multiple trace layers are provided for interconnection between levels by means of laser drilled vias and a post plating interconnect. These features offer enhanced routing density and electrical performance when compared to single layer designs.

In one embodiment, some of the external I/O balls of the package are short circuited to the heatsink to act as a close loop ground. The ground path is short circuited via wire bond to the ground trace on the routed metal of the interconnect structure of the package and also to the ground pads of the IC device.

BRIEF DESCRIPTION OF THE DRAWINGS

A preferred embodiment of the present invention will now be described more fully with reference to the following Figures, in which.

DETAILED DESCRIPTION OF THE PREFERRED EMBODIMENT

Figure 1:
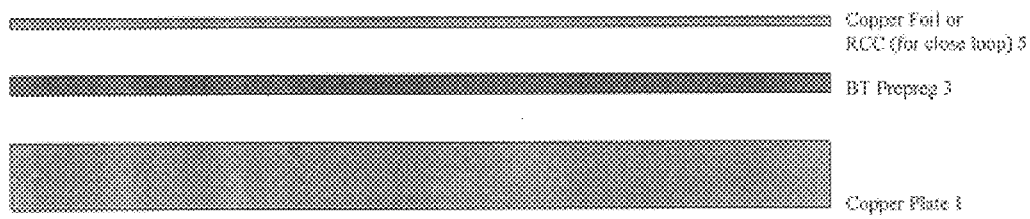
FIGS. 1 and 2 show the fabrication of a three-layer laminated carrier according to a first step in creating the IC package of the present invention.
Figure 2:

With reference to FIG. 1, a copper plate 1 is laminated with copper foil and B stage epoxy in fiberglass prepreg format. This is similar to the preparation for printed circuit boards in PCB industry with the exception that PCB industry laminates the copper foils on fiberglass backings rather than copper sheet material. An additional step may include lamination of the copper sheet with a RCC (resin coated copper) foil. Again, this is similar to PCB assembly practice. In any event a three-layer laminated carrier results (FIG. 2).

Figure 3:
FIG. 3 shows the three-layer laminated carrier of FIG. 2 subjected to a standard image transfer process for defining contact pads.
Figure 4A:
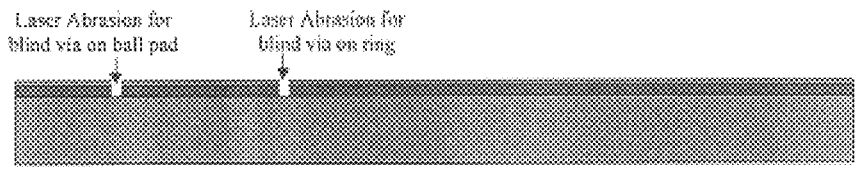
FIGS. 4A and 4B show the three-layer laminated carrier of FIG. 2 incorporating a close loop ground with etched vias at the pad on the ball and ring area (FIG. 4A), or a via constituting the entire ring (FIG. 4B)
Figure 4B:
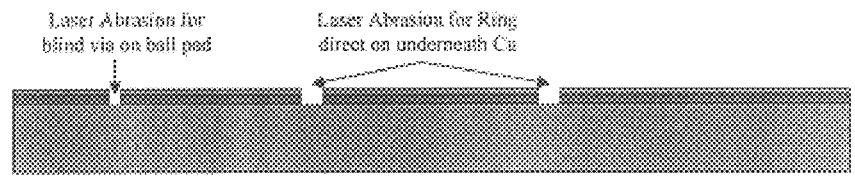
Figure 5A:
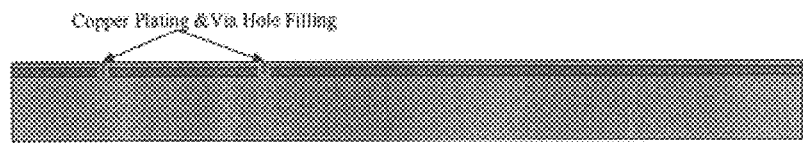
FIGS. 5A and 5B show the structures of FIGS. 4A and 4B, respectively, having the blind via holes plated up with copper and then filled with epoxy ink.
Figure 5B:
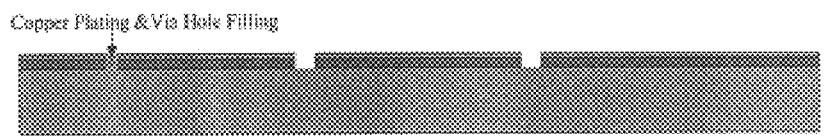
Figure 6A:
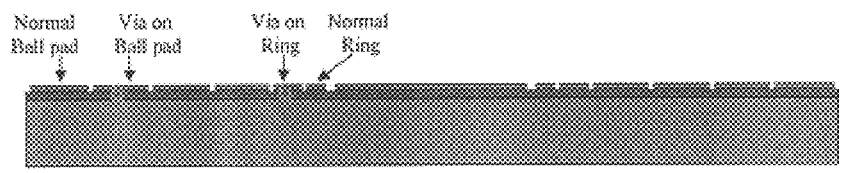
FIGS. 6A and 6B show the structures of FIGS. 4A and 4B, respectively, subjected to a standard image transfer process for defining contact pads.
Figure 6B:
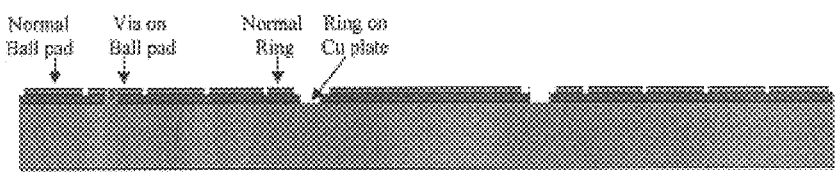

From this laminated structure, process flow may proceed either immediately to a standard image transfer process (FIG. 3), or to a closed loop construction wherein vias are etched at the contact pads on the ball and ring area (FIG. 4A), or vias forming a direct ring on the copper plate 1, as shown in FIG. 4B). For the closed loop construction of FIGS. 4A and 4B, laser ablation is used to create the vias followed by plating up the blind via holes with copper and then filling of the holes with epoxy ink (either conductive or non-conductive), as shown in FIGS. 5A and 5B. Next, the image transfer process is applied, resulting in the closed loop configurations of FIGS. 6A and 6B.

Figure 7:
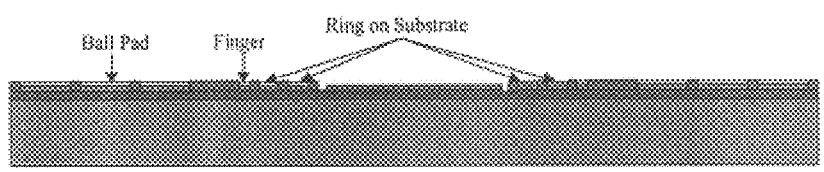
FIGS. 7, 7A and 7B show the structures of FIGS. 3, 6A and 6B, respectively, with application of a solder mask and plating up for subsequent wire bonding.
Figure 7A:
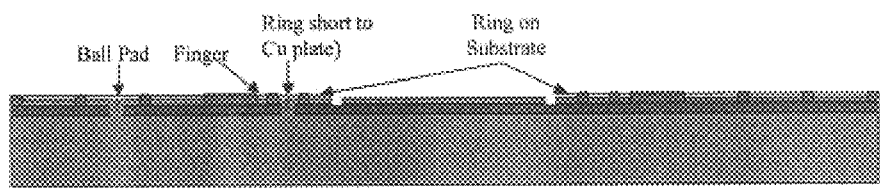
Figure 7B:
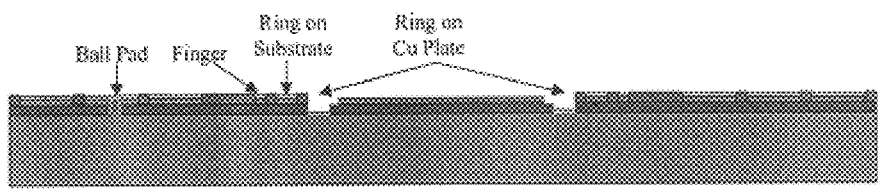

In FIGS. 7, 7A and 7B (which follow FIGS. 3, 6A and 6B, respectively), a solder mask is applied and all exposed areas are plated up with Ni/Au or other wire bondable metal surface (e.g. silver) for subsequent wire bonding and solder ball joints. For the close loop configuration of FIGS. 7A and 7B, the exposed ring on the copper plate is also Ni/Au plated (i.e. the ring functions as a direct GND ring).

Figure 8:
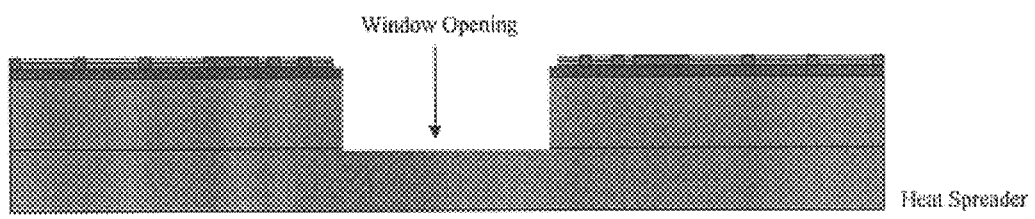
FIGS. 8, 8A and 8B show the formation of window openings and singulation of the structures of FIGS. 7, 7A and 7B, respectively, and attachment of a heat sink thereto.
Figure 8A:
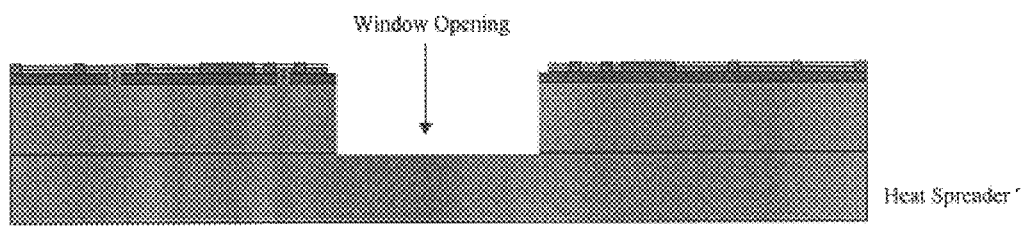
Figure 8B:
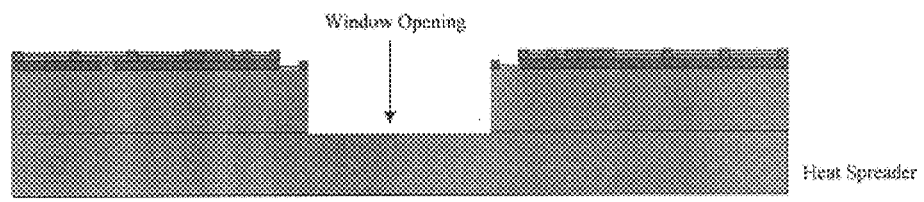
Figure 9:
FIGS. 9, 9A and 9B show the finished packages for FIGS. 8, 8A and 8B after die attach, wire bonding, encapsulation, and solder ball attach.
Figure 9A:
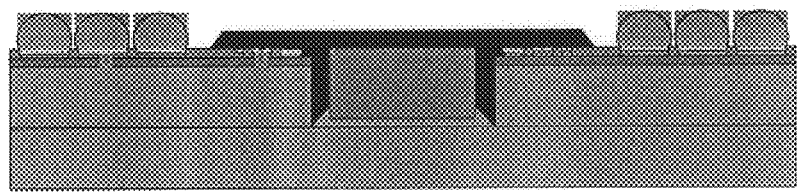
Figure 9B:
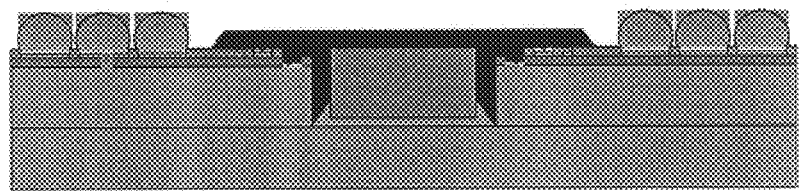

In FIGS. 8, 8A and 8B, the process flow continues with formation of window openings. The window cavities may be created either by chemical etching, mechanical milling, or mechanical down-set. A standard assembly process is then followed, including die attach, wire bonding, encapsulation, and solder ball attach, resulting in the finished packages of FIG. 9 (standard configuration with no vias), FIG. 9A (close loop configuration with ring on substrate short circuited to heat sink through vias), and FIG. 9B (close loop configuration with ring directly on heat sink). The entire substrate is attached via epoxy or adhesive film to a piece of black oxidized copper or similar plate 7, which functions as a heat spreader.

It will be understood by a person of ordinary skill in the art that, for ease of illustration only a single IC package is depicted in FIGS. 1–9, whereas in practice a matrix of such IC packages are gang fabricated on the black oxide heat spreader 7 using the lamination and etching steps set forth above. The gang fabricated product is thereafter singulated into individual IC packages either by sawing, routing or punching.

Figure 10:
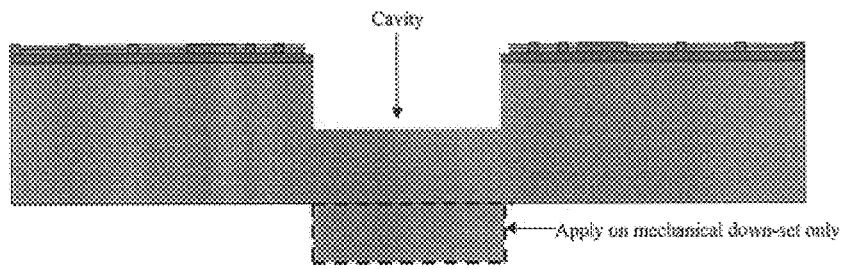
FIG. 10 shows an alternative one-piece construction of the IC package according to the present invention.

According to the alternative embodiment of FIG. 10, a one-piece construction is provided which is identical to the two-piece construction of FIGS. 1–9, with the exception that the copper plate 1 is much thicker so that a separate copper heat spreader 7 is not required.

Alternatives and variations of the invention are possible. All such embodiments and modifications are believed to be within the sphere and scope of the invention as defined by the claims appended hereto.

I claim:

1. A method of fabricating an integrated circuit package for ball grid arrays, comprising the steps of:
    laminating layers of fiberglass prepreg and copper foil to a copper plate in order to create a three-layer laminated carrier;
    patterning and etching contact pads for input/output and a power/ground ring;
    applying a solder mask and plating up said contact pads and said ring with a wire bondable metal surface;
    forming window openings for receiving semiconductor dies;
    attaching the dies within the windows, wire bonding the dies to the contact pads and said ring, encapsulating the dies, attaching solder balls to the contact pads to create finished packages and singulating the finished packages into individual packages; and
    attaching the copper plate portion of each of said individual packages to copper plate heat spreader.

2. The method of claim 1, further comprising the steps of etching blind via holes at areas where said contact pads and said ring are to be formed, plating up the blind via holes with copper and then filling the holes with epoxy ink prior to said step of patterning and etching said contact pads for input/output and a power/ground ring, thereby creating a close loop configuration of said package.

3. The method of claim 1, further comprising the steps of etching vias to form a direct ring on said copper plate, plating up said vias with copper and then filling the vias with epoxy ink prior to said step of patterning and etching said contact pads for input/output and a power/ground ring, thereby creating a close loop configuration of said package.

4. The method of claim 2 or 3, wherein said etching is performed by laser ablation.

5. The method of claim 1, wherein said step of plating up said contact pads and said ring comprises plating up with Ni/Au or other wire bondable metal surface for said subsequent wire bonding and solder ball attach steps.

6. The method of claim 1, wherein said step of forming window openings is performed by one of either chemical etching, mechanical milling, or mechanical down-set.

7. The method of claim 1 wherein the step of singulating said finished packages further comprises one of either routing, sawing or punching out said individual packages.

8. A method of fabricating an integrated circuit package for ball grid arrays, comprising the steps of:
    laminating layers of fiberglass prepreg and copper foil to a thick copper plate in order to create a three-layer laminated carrier;
    patterning and etching contact pads for input/output and a power/ground ring;
    applying a solder mask and plating up said contact pads and said ring with a wire bondable metal surface;
    forming window openings for receiving semiconductor dies; and
    attaching the dies within the windows, wire bonding the dies to the contact pads and said ring, encapsulating the dies, attaching solder balls to the contact pads to create finished packages and singulating the finished packages into individual packages.

9. The method of claim 8, further comprising the steps of etching blind via holes at areas where said contact pads and said ring are to be formed, plating up the blind via holes with copper and then filling the holes with epoxy ink prior to said step of patterning and etching said contact pads for input/output and a power/ground ring, thereby creating a close loop configuration of said package.

10. The method of claim 8, further comprising the steps of etching vias to form a direct ring on said copper plate, plating up said vias with copper and then filling the vias with epoxy ink prior to said step of patterning and etching said contact pads for input/output and a power/ground ring, thereby creating a close loop configuration of said package.

11. The method of claim 9 or 10, wherein said etching is performed by laser ablation.

12. The method of claim 8, wherein said step of plating up said contact pads and said ring comprises plating up with Ni/Au or other wire bondable metal surface for said subsequent wire bonding and solder ball attach steps.

13. The method of claim 8, wherein said step of forming window openings is performed by one of either chemical etching, mechanical milling, or mechanical down-set.

14. The method of claim 8 wherein the step of singulating said finished packages further comprises one of either routing, sawing or punching out said individual packages.

* * * * *